United States Patent
Kim

(10) Patent No.: US 9,748,484 B2
(45) Date of Patent: Aug. 29, 2017

(54) APPARATUS FOR FABRICATING OLED DISPLAY DEVICE AND METHOD OF FABRICATING OLED DISPLAY USING THE APPARATUS

(71) Applicant: SAMSUNG DISPLAY CO., LTD., Yongin, Gyeonggi-Do (KR)

(72) Inventor: Jang Sub Kim, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/819,711

(22) Filed: Aug. 6, 2015

(65) Prior Publication Data

US 2016/0271633 A1 Sep. 22, 2016

(30) Foreign Application Priority Data

Mar. 16, 2015 (KR) ........................ 10-2015-0036137

(51) Int. Cl.
*H01L 51/00* (2006.01)
*B05B 7/16* (2006.01)
*B05B 7/24* (2006.01)
*H01L 51/56* (2006.01)

(52) U.S. Cl.
CPC .......... *H01L 51/0011* (2013.01); *H01L 51/56* (2013.01)

(58) Field of Classification Search
CPC .... C08K 3/0016; H01L 51/56; H01L 51/0011
See application file for complete search history.

(56) References Cited

U.S. PATENT DOCUMENTS

| | | | | |
|---|---|---|---|---|
| 5,427,858 A | * | 6/1995 | Nakamura ............. | H05B 33/04 313/512 |
| 6,049,167 A | * | 4/2000 | Onitsuka ................. | H01L 51/56 313/24 |
| 2010/0028065 A1 | * | 2/2010 | Konno ..................... | B41J 32/02 400/194 |
| 2010/0084676 A1 | * | 4/2010 | Tanaka ................ | H01L 51/0013 257/98 |
| 2010/0201749 A1 | * | 8/2010 | Somekh ............. | B05B 17/0638 347/56 |

(Continued)

FOREIGN PATENT DOCUMENTS

| | | | |
|---|---|---|---|
| JP | 2010-073602 A | 4/2010 | |
| JP | 2011-171038 A | 9/2011 | |
| JP | 2014080009 A | * 5/2014 | ............. B41M 5/00 |

(Continued)

OTHER PUBLICATIONS

Tadashi Kajiya et al., "Controlling Profiles of Polymer Dots by Switching between Evaporation and Condensation", Langmuir Letter, Jun. 3, 2010, 26, 2010 American Chemical Society, pp. 10429-10432.

*Primary Examiner* — Caridad Everhart
(74) *Attorney, Agent, or Firm* — Lee & Morse P.C.

(57) ABSTRACT

An apparatus for fabricating an organic light-emitting diode (OLED) display device includes a chamber, a stage in the chamber to support an array substrate, a cover plate in the chamber above the stage, and a solvent absorption plate on a first surface of the cover, the solvent absorption plate including a solvent, and the solvent absorption plate facing the stage to have the array substrate face the solvent absorption plate.

20 Claims, 18 Drawing Sheets

(56) References Cited

U.S. PATENT DOCUMENTS

2014/0063094 A1* 3/2014 Bulovic ............. B05B 17/0638
347/9

FOREIGN PATENT DOCUMENTS

| KR | 10-2004-0011745 A | 2/2004 |
| KR | 10-2007-0052505 A | 5/2007 |
| KR | 10-2013-0066586 A | 6/2013 |
| KR | 10-2014-0068743 A | 6/2014 |

* cited by examiner

APPARATUS FOR FABRICATING OLED DISPLAY DEVICE AND METHOD OF FABRICATING OLED DISPLAY USING THE APPARATUS

Korean Patent Application No. 10-2015-0036137, filed on Mar. 16, 2015, in the Korean Intellectual Property Office, and entitled: "Apparatus for Fabricating OLED Display Device and Method of Fabricating OLED Display Using the Apparatus," is incorporated by reference herein in its entirety.

BACKGROUND

1. Field

Embodiments relate to an apparatus for fabricating an organic light-emitting diode (OLED) display device and a method of fabricating an OLED display device using the apparatus.

2. Description of the Related Art

Display devices have become a core technology in the information communication era. The display devices embody a variety of information on a screen and have developed into being thinner, lighter, and portable with high performance. Accordingly, various flat panel display devices capable of addressing the shortcomings of cathode ray tubes (CRTs), e.g., heavy weight and volume, such as an organic light-emitting diode (OLED) display device, have been spotlighted.

The OLED display device may be classified as a high molecular OLED display device or a low molecular OLED display device according to the type of material used in an organic light-emitting layer that generates light. The organic light-emitting layer of a low-molecular OLED display device may be formed as a thin film through vacuum deposition. On the other hand, the organic light-emitting layer of a high-molecular OLED display device may be formed as a thin film through solution coating, e.g., spin coating or inkjet printing. For example, formation of an organic light-emitting layer by inkjet printing may involve ejecting an organic light-emitting ink including an organic light-emitting material and a solvent from an inkjet printhead onto at least one pixel in a display area on a substrate and drying the ejected organic light-emitting ink.

SUMMARY

According to an embodiment, an apparatus for fabricating an organic light-emitting diode (OLED) display device includes a chamber, a stage in the chamber to support an array substrate, a cover plate in the chamber above the stage, and a solvent absorption plate on a first surface of the cover, the solvent absorption plate including a solvent, and the solvent absorption plate facing the stage to have the array substrate face the solvent absorption plate.

The apparatus for fabricating an organic light-emitting diode (OLED) display device further includes a solvent injection device which provides a stored solvent to the solvent absorption plate.

The solvent injection device may be a roller member which provides the stored solvent to the solvent absorption plate.

The solvent injection device may be an inkjet head which ejects the stored solvent onto the solvent absorption plate through a plurality of nozzles.

The stored solvents may be an organic solvent.

The apparatus for fabricating an organic light-emitting diode (OLED) display device further includes a first sealing member which contacts one side of the stage in a lengthwise direction and one side of the cover plate in the lengthwise direction and a second sealing member which contacts another side of the stage in the lengthwise direction and another side of the cover plate in the lengthwise direction.

The array substrate may be disposed in a sealed space formed by the stage, the cover plate and the first and second sealing members.

The array substrate may include a first substrate, a plurality of first electrodes disposed on the first substrate, a pixel-defining layer exposing at least some of the first electrodes therethrough, and an organic layer covering the first electrodes exposed by the pixel-defining layer.

The cover plate may include a first heat transfer unit which is disposed below the solvent absorption plate.

According to another embodiment, a method of fabricating an OLED display device includes providing a solvent to a solvent absorption plate, placing an array substrate on a stage in a chamber and placing a cover plate with the solvent absorption plate disposed thereon in the chamber and allowing the solvent to condense onto at least part of an organic layer disposed on the array substrate, wherein the solvent absorption plate and the array substrate are disposed in the chamber to face each other.

The providing may comprise providing the solvent to the solvent absorption plate using a roller member.

The providing may comprise storing the solvent in an inkjet head with a plurality of nozzles; and ejecting the solvent onto the solvent absorption plate through the nozzles.

The chamber may include a first sealing member, which contacts one side of the stage in a lengthwise direction and one side of the cover plate in the lengthwise direction, and a second sealing member, which contacts another side of the stage in the lengthwise direction and another side of the cover plate in the lengthwise direction, and the array substrate is disposed in a sealed space formed by the stage, the cover plate and the first and second sealing members.

The allowing may comprise heating the solvent absorption plate to a predetermined temperature.

The method of fabricating an OLED display device further comprises drying the array substrate.

According to yet another embodiment, a method of fabricating an OLED display device includes forming a first organic layer by drying an array substrate with an first organic film formed thereon, placing the dried array substrate on a stage in a chamber, providing a solvent to a solvent absorption plate, placing the solvent absorption plate on the cover plate, and placing the cover plate in the chamber, forming a second organic film on the array substrate by allowing the solvent to evaporate from the solvent absorption plate and forming a second organic layer by drying the array substrate with the second organic film formed thereon.

The solvent absorption plate and the cover plate may be disposed in the chamber to face each other.

The providing the solvent may comprise providing a solvent stored in a roller member to the solvent absorption plate using the roller member or ejecting a solvent stored in an inkjet head with a plurality of nozzles onto the solvent absorption plate through the nozzles.

The providing the solvent may comprise ejecting a solvent stored in a slit nozzle onto the solvent absorption plate.

The forming the second organic film may comprise allowing the solvent to evaporate from the solvent absorption plate and thus to condense onto at least part of the first organic layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
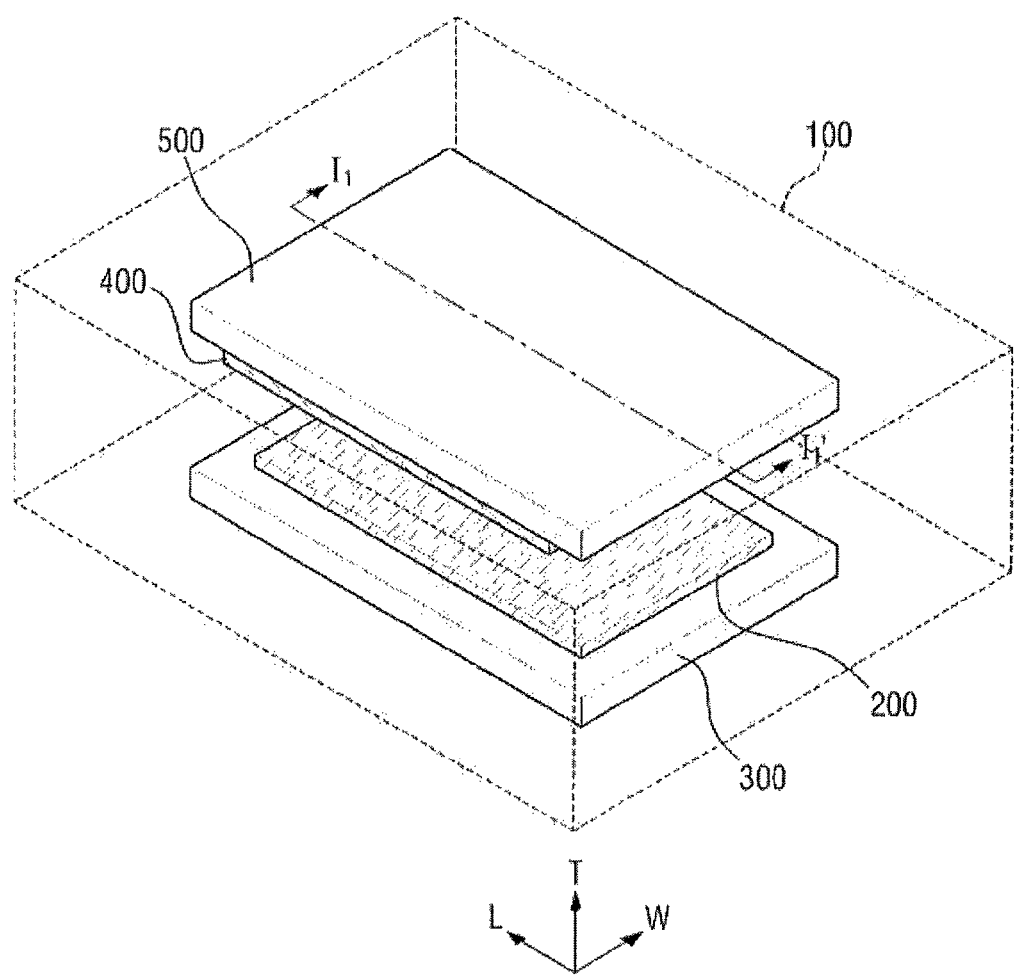
FIG. 1 illustrates a perspective view of an apparatus for fabricating an organic light-emitting diode (OLED) display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. It will also be understood that when a layer or element is referred to as being "on" another layer or element, it can be directly on the other layer or elements, or intervening layers or elements may also be present. In addition, it will also be understood that when a layer or element is referred to as being "between" two layers or elements, it can be the only layer or element between the two layers or elements, or one or more intervening layers or elements may also be present. Further, it will be understood that when an element or layer is referred to as being "connected to" or "coupled to" another element or layer, it can be directly connected or coupled to the other element or layer, or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items. Like reference numerals refer to like elements throughout.

It will be understood that, although the terms first, second, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" in reference to one figure can encompass an orientation of above in reference to another figure. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Herein, the use of the term "may," when describing embodiments, refers to "one or more embodiments." In addition, the use of alternative language, such as "or," when describing embodiments, refers to "one or more embodiments" for each corresponding item listed. Hereinafter, embodiments will be described with reference to the accompanying drawings.

FIG. 1 is a perspective view of an apparatus for fabricating an organic light-emitting diode (OLED) display device according to an exemplary embodiment.

Referring to FIG. 1, the apparatus according to the current exemplary embodiment may include a chamber 100, an array substrate 200, a stage 300, a solvent absorption plate 400, and a cover plate 500.

The chamber 100 may have an inner space, which is separated from the outside of the chamber 100, and the inner space may be a space isolated from the outside of the chamber 100. That is, the inside of the chamber 100 may be a sealed space. As illustrated in FIG. 1, the chamber 100 may have a bottom surface, which is disposed on one side of a thickness-wise direction T, and a top surface, which is opposite to the bottom surface. The chamber 100 may also include two side surfaces, which are provided along a lengthwise direction L, and two side surfaces, which are provided along a widthwise direction W. The chamber 100 is illustrated in FIG. 1 as being a hexahedron, but the size and shape of the chamber 100 are not limited to those illustrated in FIG. 1. The chamber 100 may include a metal material, but embodiments are not limited thereto. That is, the chamber 100 may be formed to include one or more materials that are appropriately selected in consideration of the level of durability required.

The array substrate 200 may be disposed in the chamber 100, e.g., on the top surface of the stage 300. The stage 300 may be rectangular in a cross-sectional view, as illustrated in FIG. 1, but embodiments are not limited thereto. That is, the stage 300 may be circular or partially curved in a cross-sectional view. For example, the stage 300 may be fixed inside the chamber 100. In another example, the stage 300 may be configured to be vertically or horizontally movable, within the chamber 100, by additional moving means (not illustrated). Also, the stage 300 may not necessarily be disposed inside the chamber 100. Instead, the stage 300 may be transported from the inside to the outside of the chamber 100 or vice versa. The stage 300 may be formed of a rigid material, but embodiments are not limited thereto. The stage 300 may include fixing means (not illustrated). Accordingly, the array substrate 200 may be fixed onto the top surface of the stage 300 by the fixing means. The type of the fixing means is not particularly limited, and examples of the fixing means encompass all suitable means capable of fixing the array substrate 200 onto the stage 300. The stage 300 will be described later in further detail with reference to FIGS. 2 and 3.

The array substrate 200 may be a unit display board or a mother board to be divided into a plurality of unit display boards. The array substrate 200 may be a single substrate or a stack of a plurality of substrates. The array substrate 200 may be a simple substrate with no particular structure formed thereon or a substrate with at least some structures formed thereon. The array substrate 200 may be, for example, an insulating substrate. For example, the insulating substrate may be formed of a transparent glass material having a transparent $SiO_2$ as a main ingredient thereof. In another example, the array substrate 200 may include an opaque material or a plastic material. The array substrate 200 may be a flexible substrate that is bendable, foldable, or rollable. The array substrate 200 is illustrated in FIG. 1 as overlapping part of the stage 300, but embodiments are not limited thereto. The array substrate 200 will be described later in further detail with reference to FIGS. 5 to 9.

The solvent absorption plate 400 may be disposed on a first surface of the cover plate 500. The first surface of the cover plate 500 with the solvent absorption plate 400 may be a bottom surface of the cover plate 500, as illustrated in FIG. 1. Accordingly, the solvent absorption plate 400 may be disposed on the bottom of the cover plate 500 to face the array substrate 200. The solvent absorption plate 400 may be a predetermined distance apart from the array substrate 200. The solvent absorption plate 400 may be rectangular in a cross-sectional view, but embodiments are not limited thereto. That is, the solvent absorption plate 400 may be polygonal, or at least partially circular, in a cross-sectional view. The solvent absorption plate 400 may be implemented as a single plate or a stack of a plurality of plates. The solvent absorption plate 400 may be fixed onto the bottom surface of the cover plate 500, and may be provided with a solvent by a solvent injection device, which will be described later with reference to FIGS. 4 and 10. The solvent is for dissolving an organic light-emitting material, and a highly-volatile solvent that easily blends with the organic light-emitting material may be used as the solvent. For example, the solvent may be an organic solvent, but embodiments are not limited thereto. That is, the solvent may be appropriately selected in consideration of the type of organic layer to be formed on the array substrate 200.

The cover plate 500 may be formed of glass or a plastic material, but embodiments are not limited thereto. For example, the cover plate 500 may be formed to have optical transmissivity. The cover plate 500 may be disposed inside the chamber 100 via fixing means (not illustrated) provided in the chamber 100. The location of the cover plate 500 in the chamber 100 is not particularly limited as long as the solvent absorption plate 400 and the array substrate 200 can be disposed to face each other with the predetermined distance apart. Therefore, one or more guide rails (not illustrated) may be provided in the chamber 100 to make the solvent absorption plate 400, which is disposed at the bottom of the cover plate 500, movable while maintaining the predetermined distance from the array substrate 200.

The stage 300 is illustrated in FIG. 1 as being disposed below the cover plate 500 where the solvent absorption plate 400 is located, but embodiments are not limited thereto. That is, the arrangement of the elements in the chamber 100 is not particularly limited as long as the array substrate 200 and the solvent absorption plate 400 can be arranged to face each other. The array substrate 200 and the solvent absorption plate 400 may not necessarily be disposed to be in parallel to each other in the chamber 100.

Figure 2:
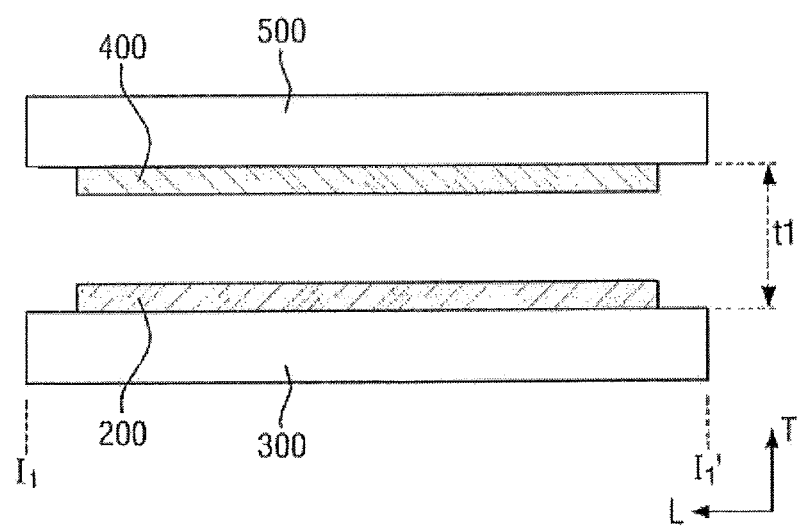
FIG. 2 illustrates a cross-sectional view along line $I_1$-$I_1'$ of FIG. 1.
Figure 3:
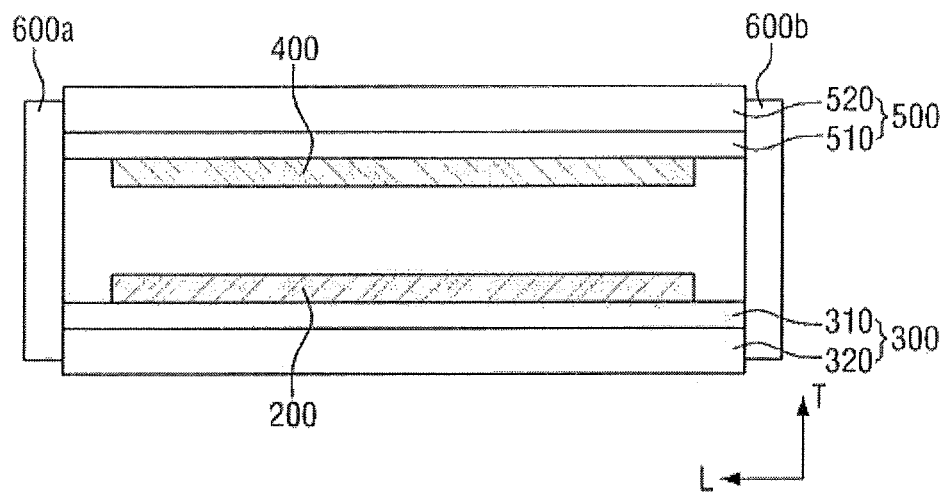
FIG. 3 illustrates a detailed cross-sectional view of the apparatus of FIG. 1.

FIG. 2 is a cross-sectional view along line $I_1$-$I_1'$ of FIG. 1. FIG. 3 is a detailed cross-sectional view of the apparatus according to the exemplary embodiment of FIG. 1.

Referring to FIGS. 2 and 3, the stage 300, where the array substrate 200 is disposed, and the cover plate 500, where the solvent absorption plate 400 is disposed, may be a predetermined distance t1 apart from each other. The distance t1 may not be particularly limited as long as a proper solvent atmosphere can be formed by a solvent evaporated from the solvent absorption plate 400. The apparatus according to the exemplary embodiment of FIG. 1 may also include first and second sealing members 600a and 600b (FIG. 3). The first sealing member 600a may contact a first side of the stage 300 in the lengthwise direction L and a first side of the cover plate 500 in the lengthwise direction L. The second sealing member 600b may contact a second side of the stage 300 in the lengthwise direction L and a second side of the cover plate 500 in the lengthwise direction L. Accordingly, the array substrate 200 may be located in a sealed space formed, e.g., defined, by the stage 300, the cover plate 500, and the first and second sealing members 600a and 600b. Since the array substrate 200 is located in the sealed space, the concentration of a solvent in a gaseous state evaporated from the solvent absorption plate 400 in the vicinity of the array substrate 200 may increase. In the description that follows, it is assumed that the array substrate 200 is disposed in the sealed space formed by the first and second sealing members 600a and 600b for a case when a solvent atmosphere is formed, even though not illustrated in the drawings as such.

As illustrated in FIG. 3, the cover plate 500 may include a first seating portion 510 and a first temperature adjustment portion 520. The first seating portion 510 may directly contact the solvent absorption plate 400, and may fix the solvent absorption plate 400. The first seating portion 510 may have a circular plate-like planar shape or a partially curved planar shape.

The first temperature adjustment portion 520 may be positioned on the first seating portion 510, i.e., the first seating portion 510 may be between the first temperature adjustment portion 520 and the solvent absorption plate 400. The first temperature adjustment portion 520 may transmit heat to the solvent absorption plate 400, e.g., through the first seating portion 510. For example, the first temperature adjustment portion 520 may transmit heat to the solvent absorption plate 400 through conduction. Accordingly, the first temperature adjustment portion 520 may include hot wires for transmitting heat. In response to the first temperature adjustment portion 520 continuing to transmit heat to the solvent absorption plate 400 for a predetermined amount of time, the evaporation of a solvent from the solvent absorption plate 400 may be facilitated.

The stage 300 may include a second seating portion 310 and a second temperature adjustment portion 320. The second seating portion 310 may directly contact the array substrate 200 and may fix the array substrate 200. The second seating portion 310 may fix the array substrate 200 through vacuum suction, but embodiments are not limited thereto. The shape of the second seating portion 310 is not particularly limited as long as the second seating portion 310 can properly fix the array substrate 200. For example, the second seating portion 310 may be formed to have a circular plate-like planar shape or a partially curved planar shape, conforming to the shape of the array substrate 200. The second seating portion 310 may include a metal material.

The second temperature adjustment portion 320 may be positioned on the second seating portion 310, i.e., the second seating portion 310 may be between the second temperature adjustment portion 320 and the array substrate 200. The second temperature adjustment portion 320 may adjust the temperature of the array substrate 200, e.g., through the second seating portion 310. For example, the second temperature adjustment portion 320 may transmit heat to the array substrate 200 through conduction. In response to the second temperature adjustment portion 320 applying heat to the array substrate 200, the dissolution of an organic layer disposed on the array substrate 200 may be facilitated, which will be described later in detail.

It is not necessary that both the stage 300 and the cover plate 500 include a temperature adjustment portion. For example, only one of the stage 300 and the cover plate 500 may include a temperature adjustment portion.

Figure 4A:
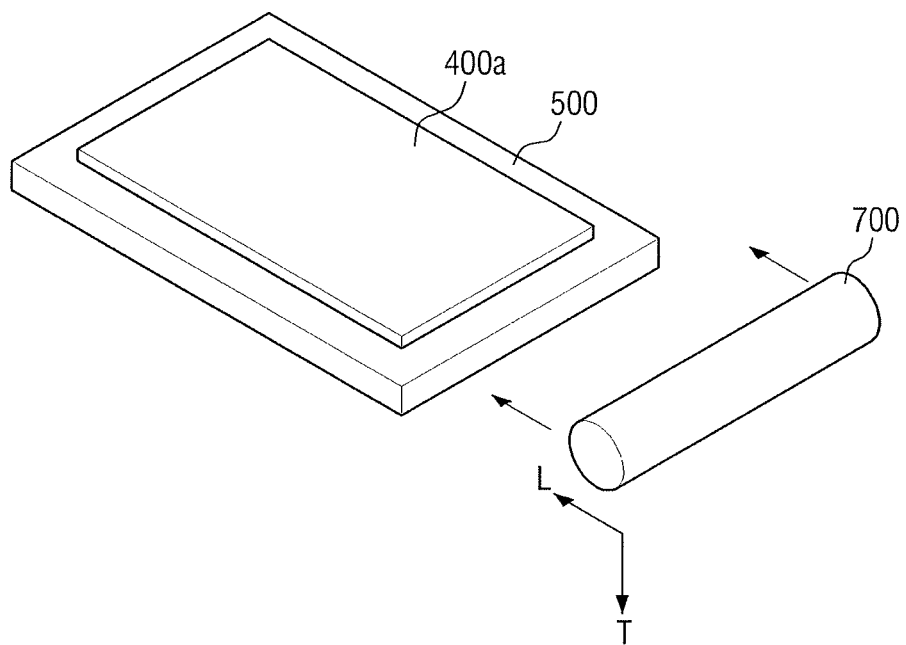
FIGS. 4(a) and 4(b) illustrate perspective views for explaining an example of a solvent absorption process of a solvent absorption plate of the apparatus of FIG. 1.
Figure 4B:
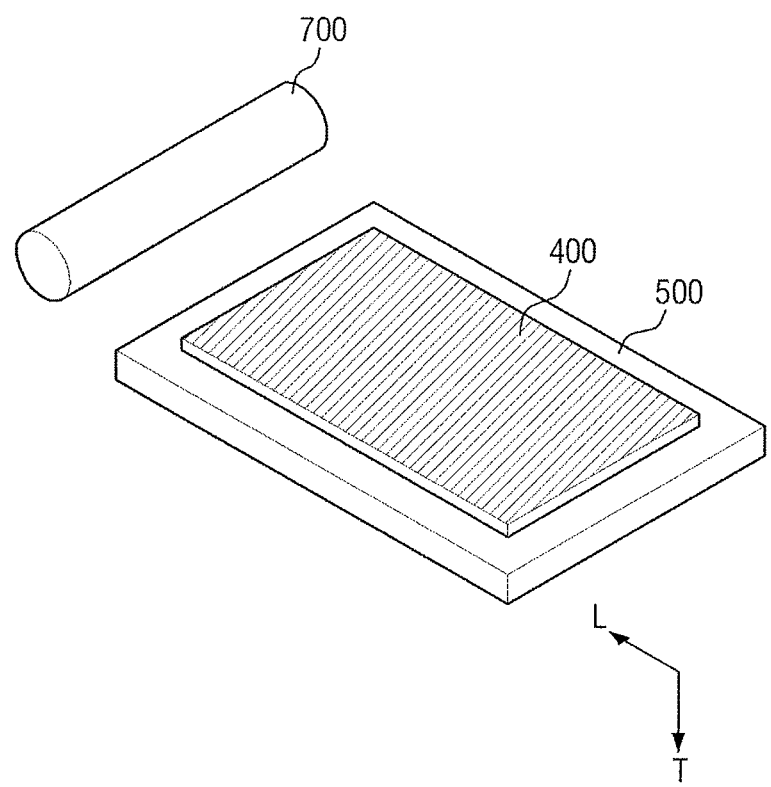

FIGS. 4(a) and 4(b) illustrate perspective views of stages in a solvent absorption process of the solvent absorption plate 400.

Referring to FIG. 4(a), a solvent absorption plate 400a may be disposed on one surface of the cover plate 500, e.g., on the first surface of the cover plate 500. FIG. 4(a) illustrates the solvent absorption plate 400a in a state yet to be provided with a solvent by the solvent injection device. As already mentioned above, the solvent absorption plate 400a may be fixed onto one surface of the cover plate 500. The solvent injection device may include a storage unit, which stores a solvent therein, a solvent providing unit, which provides the stored solvent to the solvent absorption plate 400a, and moving means, which allows the stored solvent to be uniformly provided to the solvent absorption plate 400a.

For example, referring back to FIG. 4(a), the solvent injection device may be a roller member 700, which provides a solvent stored therein to the solvent absorption plate 400a. The roller member 700 may be positioned above the solvent absorption plate 400a, e.g., the solvent absorption plate 400a may be between the first surface of the cover plate and the roller member 700.

In the description that follows, it is assumed that the solvent injection device is the roller member 700. The roller member 700 may have a storage unit in which to store a solvent. For example, the solvent stored in the storage unit may be in a liquid phase. In another example, the roller member 700 may not include any storage unit therein, e.g., a solvent may be formed on the outside of the roller member 700. Accordingly, the roller member 700 may roll over the solvent absorption plate 400a, e.g., along the arrows in FIG. 4(a), to provide a sufficient amount of solvent to the, e.g., entire, solvent absorption plate 400a through rolling. The roller member 700 may be disposed in the chamber 100, but embodiments are not limited thereto. That is, the roller member 700 may be disposed outside the chamber 100.

Referring to FIG. 4(b), the solvent absorption plate 400a may absorb a sufficient amount of solvent from the roller member 700 through the rolling of the roller member 700 thereon. Once the sufficient amount of solvent is absorbed, e.g., based on the amount of solvent required for a subsequent process with the organic material layer of the array substrate 200, the solvent absorption plate 400a becomes the solvent absorption plate 400 in FIGS. 2-3. For example, the cover plate 500 with the solvent absorption plate 400 in FIG. 4(b) may be rotated, e.g., turned, for the solvent absorption plate 400 to face the stage 300, e.g., and the array substrate 200 thereon.

Figure 5:
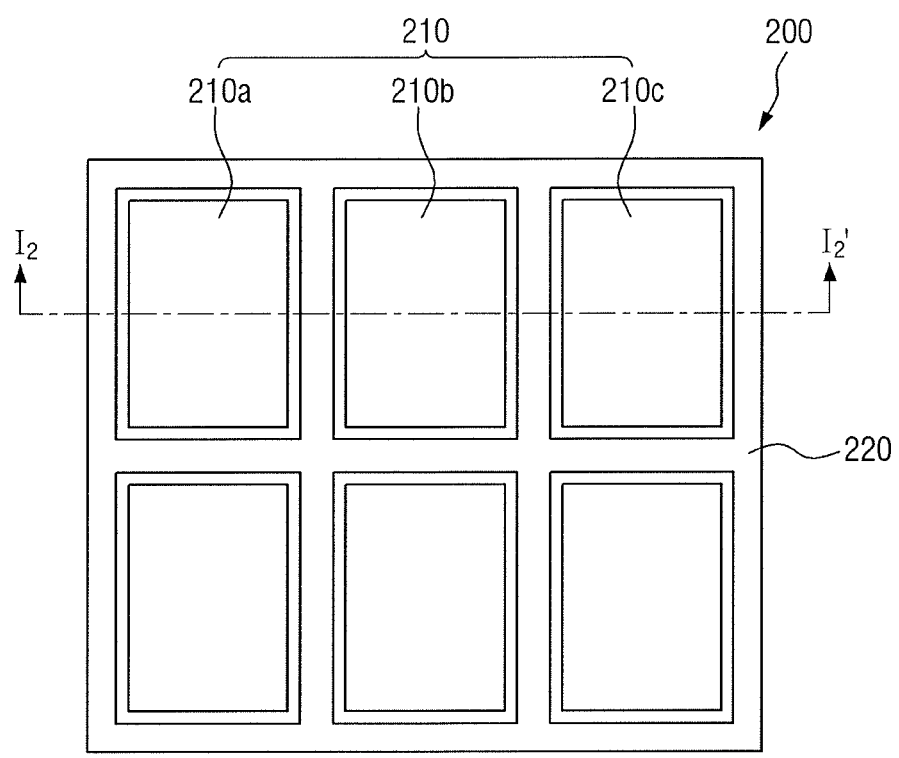
FIG. 5 illustrates a plan view of part of an array substrate of the apparatus of FIG. 1.
Figure 6:
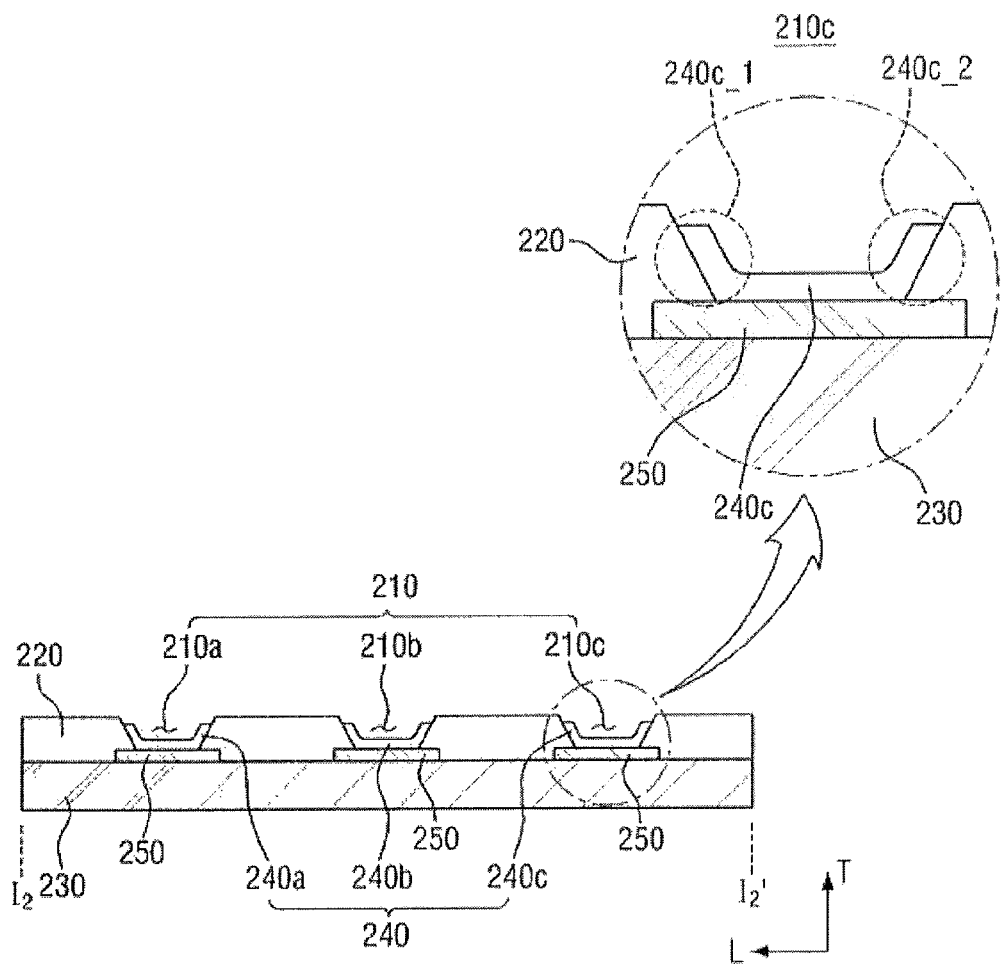
FIG. 6 illustrates a cross-sectional view along line $I_2$-$I_2'$ of FIG. 5.

FIG. 5 is a plan view of part of the array substrate 200. FIG. 6 is a cross-sectional view of the array substrate 200 along line $I_2$-$I_2$' of FIG. 5. The array substrate 200 as illustrated in FIG. 6 may be in a state yet to be processed by the apparatus according to the exemplary embodiment of FIG. 1. Therefore, in FIG. 6, an organic layer (i.e., an organic layer 240 of FIG. 5 or 7) to be processed by the apparatus according to the exemplary embodiment of FIG. 1 may be indicated individually by reference numeral 240 (particularly, by reference numerals 240a, 240b and 240c), and an organic layer (i.e., an organic layer 240' of FIG. 8) already processed by the apparatus according to the exemplary embodiment of FIG. 1 may be indicated by reference numeral 240' (particularly, by reference numerals 240a', 240b' and 240c'.

Referring to FIG. 5, a plurality of pixel units 210 may be defined on the array substrate 200 by a pixel-defining layer 220. For example, the pixel units 210 may have a rectangular shape. The pixel units 210 may be arranged in a n×m matrix (where n and m are integer values greater than 1). For example, the pixel units 210 may include a first pixel 210a, a second pixel 210b, and a third pixel 210c.

Referring to FIG. 6, the array substrate 200 may include the pixel-defining layer 220, a first substrate 230, an organic layer 240, and a plurality of first electrodes 250. While not specifically illustrated in FIG. 6, the array substrate 200 may also include various other structures formed on an insulating substrate. Examples of the various other structures include, for example, wiring, electrodes and insulating layers. If an OLED display device to be fabricated is of an active type, the array substrate 200 may also include a plurality of thin-film transistors on the first substrate 230.

As illustrated in FIG. 6, the first electrodes 250 may be disposed on the first substrate 230. The first electrodes 250 may be spaced from one another. For example, the first electrodes 250 may be anode electrodes. In this example, the first electrodes 250 may be formed of a conductive material with a high work function. If the OLED display device to be fabricated is of a bottom emission type, the first electrodes 250 may be formed, e.g., of indium tin oxide (ITO), indium zinc oxide (IZO), ZnO, $In_2O_3$ or a deposition layer thereof. On the other hand, if response to the OLED display device to be fabricated is of a top emission type, the first electrodes 250 may include a reflective layer formed of, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). The first electrodes 250 may be formed using two or more of the aforementioned materials to have a structure consisting of at least two layers.

The pixel-defining layer 220 may be formed on the first electrodes 250. The pixel-defining layer 220 may expose at least part of each of the first electrodes 250. That is, each of the first electrodes 250 may be either partially or completely exposed by the pixel-defining layer 220. In a case when each of the first electrodes 250 is completely exposed by the pixel-defining layer 220, each of the first electrodes 250 may be a predetermined distance apart from the pixel-defining layer 220. The pixel-defining layer 220 may include at least one organic material of, e.g., benzocyclobutene (BCB), polyimide (PI) and polyamide (PA), or may include an inorganic material, e.g., silicon nitride. The pixel-defining layer 220 may be formed by mask patterning, e.g., patterning using a fine metal mask. The pixel-defining layer 220 may be formed of a photosensitive agent including a black pigment, in which case, the pixel-defining layer 220 may serve as a light-shielding member.

Figure 14:
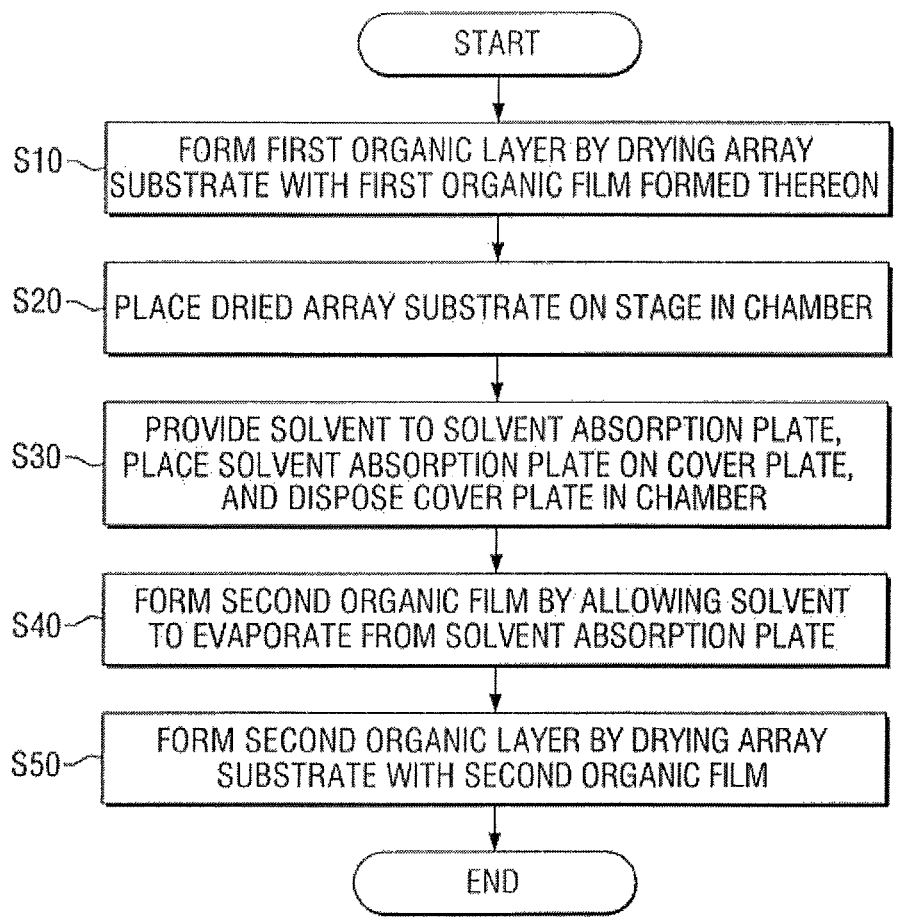
FIG. 14 illustrates a detailed flowchart of the method of FIG. 13.

The organic layer 240 may be disposed on the first electrodes 250. As described above, the organic layer 240 may be in a state yet to be processed by the apparatus according to the exemplary embodiment of FIG. 1, as illustrated in FIGS. 14 and 15. The organic layer 240 may include various organic material layers that may be included in an OLED display device, e.g., an organic light-emitting layer (EML), a hole injection layer (HIL), a hole transport layer (HTL), an electron injection layer (EIL), and an electron transport layer (ETL). The organic layer 240 may have a single-layer structure including one of the organic material layers or a multilayer structure including two or more of the organic material layers.

For example, the organic layer 240 may include three organic layer segments 240a, 240b, and 240c, which correspond to the first, second, and third pixels 210a, 210b, and 210c, respectively. The three organic layer segments 240a, 240b, and 240c may include different organic materials to emit different colors of beams, e.g., red, green, and blue beam, but embodiments are not limited thereto. The term "the organic layer 240" may be understood as referring to one or more of the three organic layer segments 240a, 240b and 240c.

The organic layer 240 may be formed as a thin film by spin coating or an inkjet printing. More specifically, the organic layer 240 may be formed through inkjet printing by ejecting an organic light-emitting ink including an organic light-emitting material and a solvent from an inkjet printhead onto at least one pixel in a display area and drying the organic light-emitting ink. The dried organic light-emitting ink may indicate the organic light-emitting ink with the solvent evaporated therefrom.

For example, referring to the enlarged portion of FIG. 6, the third organic layer segment 240c may include a central part and edge parts 240c_1 and 240c_2 on either side of the central part. The organic layer segment 240c may be thinner in the central part than in the edge parts 240c_1 and 240c_2 due to the drying characteristics of an organic material that forms the third organic layer segment 240c.

Figure 7:
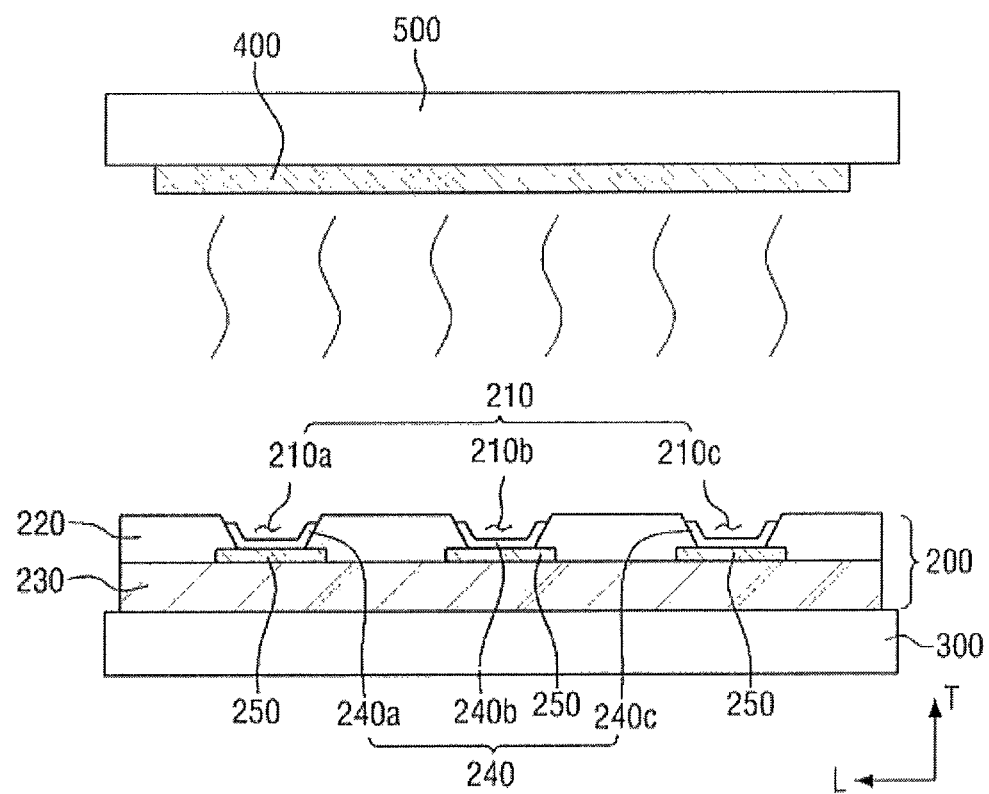
FIGS. 7 and 8 illustrate cross-sectional view for explaining processes performed by the apparatus of FIG. 1.
Figure 8:
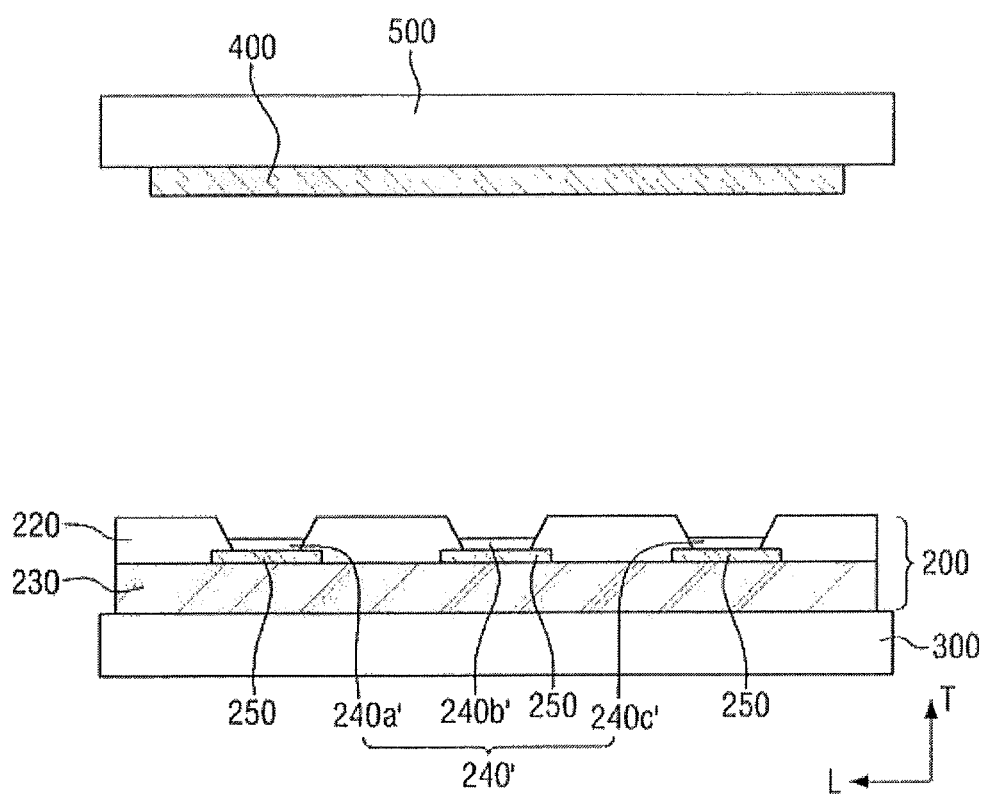
Figure 9A:
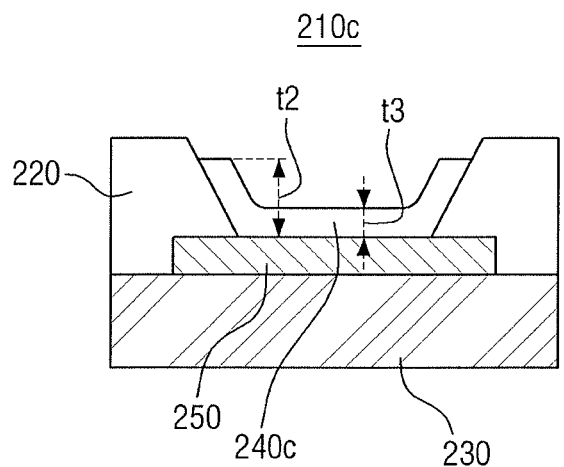
FIGS. 9(a) and 9(b) illustrate cross-sectional views for explaining an organic layer obtained by the processes of FIGS. 7 and 8, respectively.
Figure 9B:
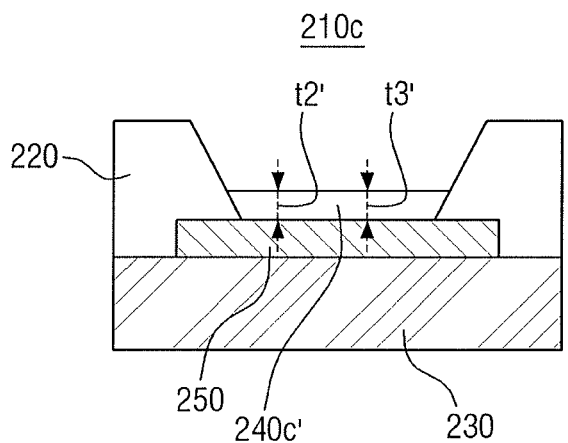

FIGS. 7 and 8 are cross-sectional view of stages performed by the apparatus according to the exemplary embodiment of FIG. 1. FIGS. 9(a) and 9(b) illustrate cross-ssectional views for explaining an organic layer obtained by the processes of FIGS. 7 and 8. For convenience, the organic layer 240 of FIG. 7 and the organic layer 240' of FIG. 8 will hereinafter be referred to as the first organic layer 240 and the second organic layer 240', respectively, and the chamber 100 is not illustrated in FIGS. 7 and 8. Although not specifically illustrated, it is assumed that the first and second sealing members 600a and 600b of FIG. 3 are placed in contact with the cover plate 500 and the stage 300 and thus form a sealed space together with the stage 300 and the cover plate 500. It is also assumed that the solvent absorption plate 400 has a sufficient amount of solvent absorbed thereinto through the processes described above with reference to FIGS. 4(a) and 4(b).

Referring to FIGS. 6 and 7, the array substrate 200 with the first organic layer 240 formed on the top surface thereof may be disposed on the top surface of the stage 300, e.g., the first substrate 230 of the array substrate 200 may be directly on the stage 300. The solvent absorption plate 400 may be disposed on the bottom surface of the cover plate 500 to face the pixel-defining layer 220 of the array substrate 200. As a result, the array substrate 200 may be disposed in a sealed space to face the solvent absorption plate 400.

As described previously with reference to FIG. 6, the third organic layer segment 240c may include the central part and the edge parts 240c_1 and 240c_2. FIG. 6 illustrates the structure of the third organic layer segment 240c only, but the other organic layer segments (i.e., the first and second organic layer segments 240a and 240b) may also include a central part and edge parts. The first organic layer 240, which is disposed on the array substrate 200, may be formed to have a non-uniform thickness due to its drying characteristics. More specifically, as illustrated in FIGS. 6 and 7, the first organic layer 240 may be relatively thicker at the edge parts than in the central part of each of the first, second, and third organic layer segments 240a, 240b and 240c.

Figure 15A:
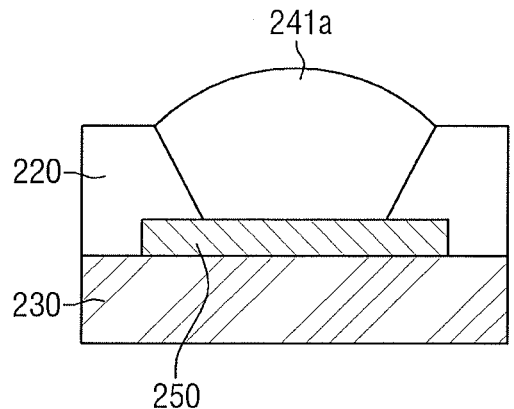
FIGS. 15(a)-15(d) illustrate cross-sectional views of stages in the method of FIG. 14.
Figure 15B:
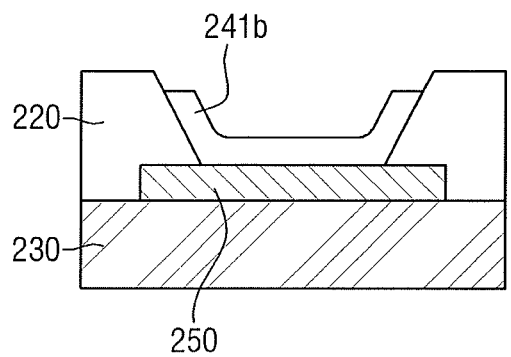
Figure 15C:
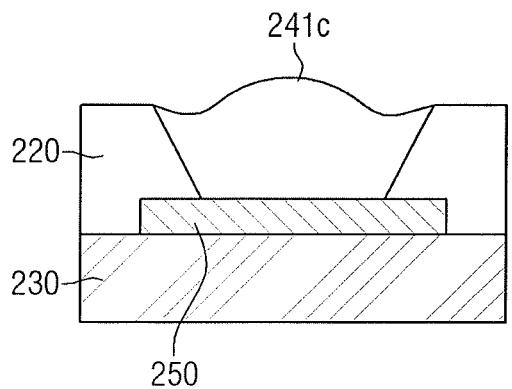

Referring to FIG. 7, the array substrate 200 may be disposed in the sealed space to face the solvent absorption plate 400, and a solvent atmosphere may be formed in the sealed space. More specifically, the sealed space may be filled with a solvent in a gaseous state evaporated from the solvent absorption plate 400. The solvent in the gaseous state may condense upon contact with the first organic layer 240 on the array substrate 200. That is, the solvent may have a melting capacity for the first organic layer 240, and may thus dissolve at least part of the first organic layer 240 upon contact with the first organic layer 240. The partially-dissolved first organic layer 240 may be at least partially in a liquid phase for a predetermined amount of time and may then become an organic film as illustrated in FIG. 15(c).

The array substrate 200 may be taken out of the chamber 100 and may then be subjected to a drying process. However, the drying process may not necessarily be performed outside the chamber 100. Instead, the drying process may be performed inside the chamber 100. The drying process will be described later in detail with reference to FIGS. 13 to 15.

Referring to FIG. 8, the first organic layer 240 of FIG. 7, which is in the form of an organic film, may be transformed into the second organic layer 240' after the drying process. The second organic layer 240', unlike the first organic layer 240 of FIG. 7, may have a relatively uniform thickness.

In detail, the first and second organic layers 240 and 240' will hereinafter be described in further detail with reference to FIGS. 9(a) and 9(b), taking as examples the third organic layer segments 240c and 240c', which correspond to the third pixel 210c. Referring to FIG. 9(a), the first organic layer 240c with a non-uniform thickness may be initially formed on the first electrode 250 (i.e., prior to being processed by the apparatus according to the exemplary embodiment of FIG. 1). That is, a thickness t2 of an edge part of the first organic layer 240c may be greater than a thickness t3 of the central part of the first organic layer 240c. However, referring to FIG. 9(b), once processed by the apparatus according to the exemplary embodiment of FIG. 1, the second organic layer 240c' with a relatively uniform thickness may be formed on the first electrode 250. That is, a thickness t2' of an edge part of the second organic layer 240c' may be substantially the same, e.g., may not differ much from, a thickness t3' of a middle part of the second organic layer 240c'.

Figure 10:
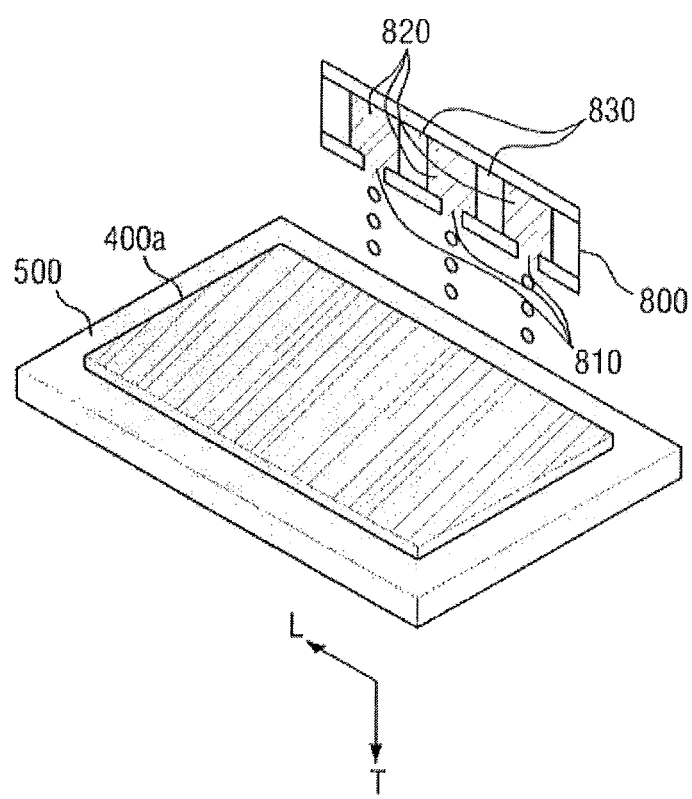
FIG. 10 illustrates a perspective view for explaining another example of the solvent absorption process of the solvent absorption plate of the apparatus of FIG. 1.

FIG. 10 is a perspective view for explaining another example of the solvent absorption process of a solvent absorption plate. More specifically, FIG. 10 illustrates the solvent absorption plate 400a in a state yet to absorb a solvent.

Referring to FIG. 10, the solvent injection device may be an inkjet head 800. The inkjet head 800 may include a plurality of nozzles 810, through which a solvent is ejected, a plurality of storage units 820, which store a solvent therein, and a plurality of partitions 830, which are disposed among the storage units 820. The inkjet head 800 may be a predetermined distance apart from the solvent absorption plate 400a, which is disposed on one surface of the cover plate 500.

For example, the inkjet head 800 may extend in parallel to one side of the solvent absorption plate 400a. The inkjet head 800 may be disposed inside the chamber 100 or outside the chamber 100. In a case when the inkjet head 800 is disposed inside the chamber 100, the apparatus according to the exemplary embodiment of FIG. 1 may also include additional moving means, e.g., a motor and an actuator. The nozzles 810 may be aligned in a row along a lengthwise direction of the inkjet head 800, but embodiments are not limited thereto, e.g., the nozzles 810 may be aligned to conform to the arrangement of the solvent absorption plate 400a on the cover plate 500. The inkjet head 800 may eject a solvent stored therein onto the solvent absorption plate 400a through the nozzles 810. For example, the inkjet head 800 may eject the solvent toward the solvent absorption plate 400a while moving at a constant speed above the solvent absorption plate 400a with the aid of the additional moving means. In another example, the cover plate 500 may move with the inkjet head 800 fixed. The inkjet head 800 may continuously eject the solvent stored therein, or may intermittently eject the solvent stored therein. The apparatus according to the exemplary embodiment of FIG. 1 may precisely control the amount of solvent to be ejected by ejecting a solvent onto the solvent absorption plate 400a with the use of the inkjet head 800.

While not specifically illustrated in FIG. 10, the apparatus according to the exemplary embodiment of FIG. 1 may provide a solvent to the solvent absorption plate 400a using other devices. For example, the apparatus according to the exemplary embodiment of FIG. 1 may include a slit nozzle, instead of the roller member 700 of FIG. 4 or the inkjet head 800 of FIG. 10.

FIGS. 11(a)-11(d) and 12(a)-12(d) illustrate graphs for explaining the in-pixel uniformity (IPU) of an OLED display device fabricated by the apparatus according to the exemplary embodiment of FIG. 1. In FIGS. 11(a)-11(d) and 12(a)-12(d), the array substrate 200 is about 6.83 thick.

Figure 11A:
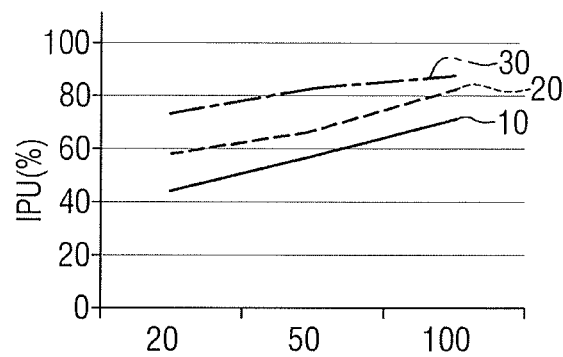
FIGS. 11(a)-11(d) and 12(a)-12(d) illustrate graphs for explaining the in-pixel uniformity (IPU) of an OLED display device fabricated by the apparatus of FIG. 1.
Figure 11B:
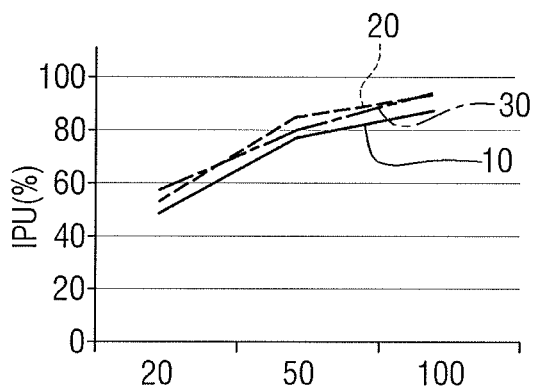
Figure 11C:
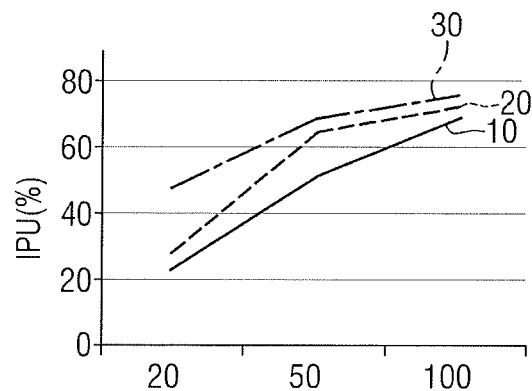
Figure 11D:
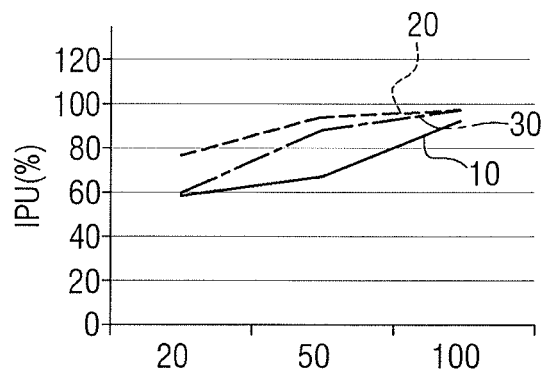
Figure 12A:
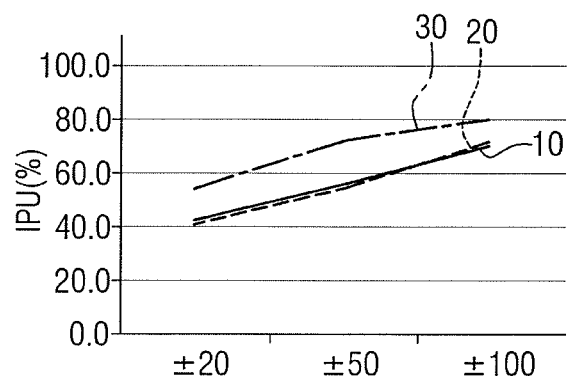
Figure 12B:
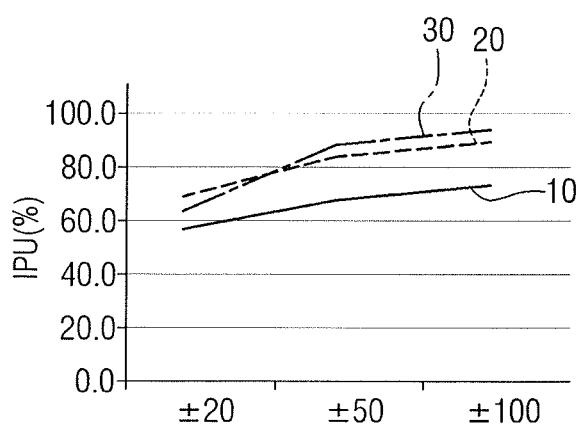
Figure 12C:
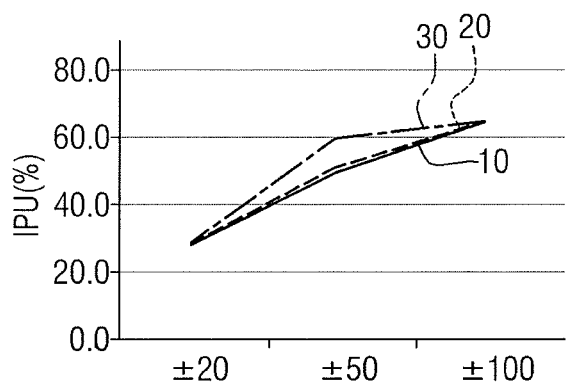
Figure 12D:
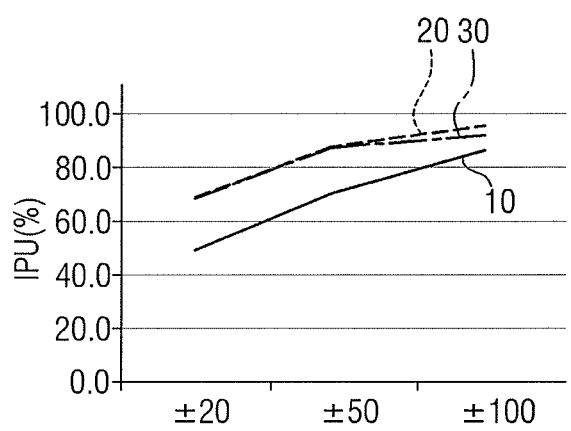

More specifically, FIGS. 11(a)-11(d) illustrate graphs for explaining the IPU of HILs, which show the profile of the HILs, and FIGS. 12(a)-12(d) illustrate graphs for explaining the IPU of HTLs, which show the profile of the HTLs. FIGS. 11(a) and 12(a) represent a blue X axis, FIGS. 11(b) and 12(b) represent a blue Y axis, FIGS. 11(c) and 12(c) represent a red/green X axis, and FIGS. 11(d) and 12(d) represent a red/green Y axis.

Referring FIGS. 11(a)-11(d), reference numeral 10 represents an HIL not processed by the apparatus according to the exemplary embodiment of FIG. 1, reference numeral 20 represents an HIL processed by the apparatus according to the exemplary embodiment of FIG. 1 for about seven minutes with the use of a solvent with a DMI:cyclo mixture ratio of 1:1, and reference numeral 30 represents an HIL processed by the apparatus according to the exemplary embodiment of FIG. 1 for about three minutes with the use of a solvent with a DMI:cyclo mixture ratio of 1:1. As illustrated in FIGS. 11(a)-11(d), the HILs 20 and 30 have an improved IPU, compared to the HIL 10, and such IPU improvement is more apparent in a 20 Å to 50 Å area than in a 100 Å area.

Referring to FIGS. 12(a)-12(d), reference numeral 10 represents an HTL not processed by the apparatus according to the exemplary embodiment of FIG. 1, reference numeral 20 represents an HTL processed by the apparatus according to the exemplary embodiment of FIG. 1 for about three minutes with the use of a solvent with a CB:MAS mixture ratio of 1:3, and reference numeral 30 represents an HTL processed by the apparatus according to the exemplary embodiment of FIG. 1 for about three minutes with the use of a solvent with a CB:MAS mixture ratio of 1:1. As illustrated in FIGS. 12(a)-12(d), the HTLs 20 and 30 have an improved IPU, compared to the HTL 10, and such IPU improvement is more apparent in the case of using a solvent with the CB:MAS mixture ratio of 1:1 than in the case of using a solvent with the CB:MAS mixture ratio of 1:3.

Figure 13:
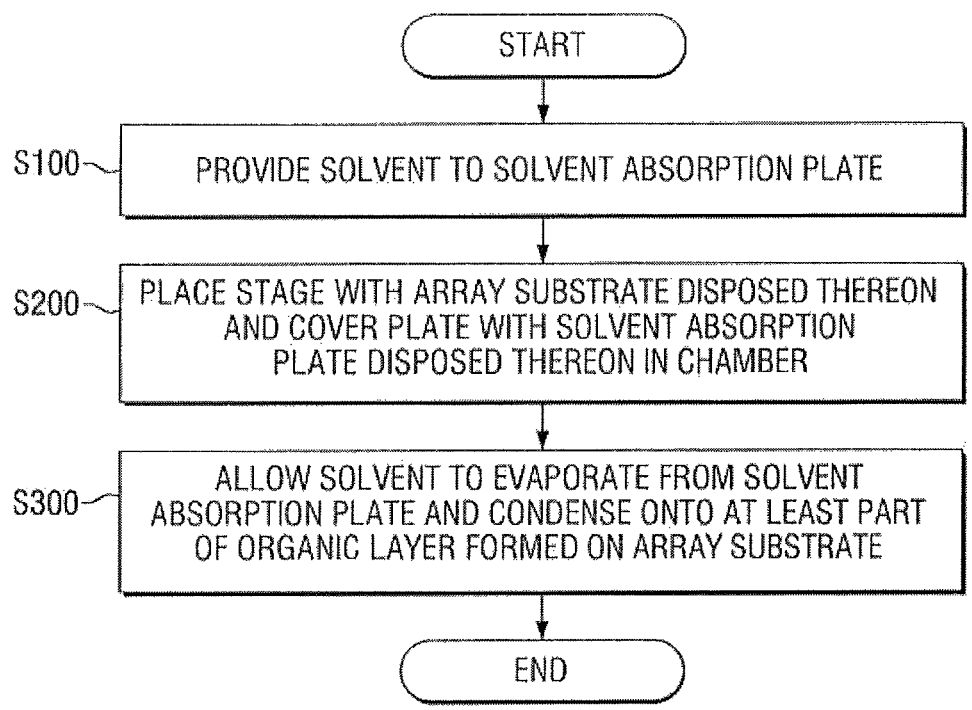
FIG. 13 illustrates a flowchart of a method of fabricating an OLED display device according to an exemplary embodiment.

FIG. 13 is a flowchart illustrating a method of fabricating an OLED display device according to an exemplary embodiment. FIG. 14 is a detailed flowchart illustrating the method of FIG. 13. FIGS. 15(a)-15(d) illustrates cross-sectional views of the array substrate 200 for explaining each step of the method of FIG. 14. In FIGS. 1 to 15(d), like reference numerals indicate like elements, and detailed descriptions will be avoided for simplicity.

Referring to FIG. 13, the method according to the exemplary embodiment of FIG. 1 may include providing a solvent to the solvent absorption plate 400 (S100), placing the stage 300 with the array substrate 200 disposed thereon and the cover plate 500 with the solvent absorption plate 400 disposed thereon in the chamber 100 (S200), and evaporating the solvent in the solvent absorption plate 400 (S300) so as for the solvent to condense onto at least part of the organic layer 240 on the array substrate 200.

In detail, operation S100 of FIG. 13, i.e., providing a solvent to the solvent absorption plate 400, will hereinafter be described with reference to FIGS. 4 and 13. The solvent absorption plate 400 may be provided with a solvent by a solvent injection device. Therefore, the solvent absorption plate 400 may be disposed on one surface of the cover plate 500. For example, the solvent injection device may be the roller member 700 (FIG. 4), in which case, the solvent may be provided to the solvent absorption plate 400 through the rolling of the roller member 700. For example, the solvent may be an organic solvent, but embodiments are not limited thereto. That is, the solvent may be appropriately selected in consideration of the type of organic layer to be formed on the array substrate 200.

Thereafter, referring to FIGS. 7, 13 and 15, the stage 300 with the array substrate 200 disposed thereon and the cover plate 500 with the solvent absorption plate 400 disposed thereon may be placed in the chamber 10, i.e., operations S20 and S30 of FIG. 14. The array substrate 200 and the solvent absorption plate 400 may be disposed in the chamber 100 to face each other. The array substrate 200 may include the first organic layer 241b, which is formed on the first electrode 250, to have a non-uniform thickness (FIG. 15(b)).

The first organic layer 241b may be formed by spin coating or inkjet printing. More specifically, referring to FIG. 15(a), a first organic film 241a may be formed through inkjet printing by ejecting an organic light-emitting ink comprising an organic light-emitting material and a solvent from an inkjet printhead onto a display area. Thereafter, a first drying process may be performed on the first organic film 241a, thereby obtaining the first organic layer 241b, i.e., operation S10 of FIG. 14. For example, a vacuum dryer may be used in the first drying process, but embodiments are not limited thereto, e.g., various drying methods may be used in the first drying process.

The order in which the stage 300 with the array substrate 200 disposed thereon and the cover plate 500 with the solvent absorption plate 400 disposed thereon are placed in the chamber 100 is not particularly limited. FIG. 13 describes the solvent absorption plate 400 as being provided with a solvent outside the chamber 100, but embodiments are not limited thereto. That is, the cover plate 500 with the solvent absorption plate 400 disposed thereon may be placed in the chamber 100 and may then be provided with a solvent.

The array substrate 200 may be disposed in a sealed space formed by the stage 300, the cover plate 500, and the first and second sealing members 600a and 600b. Accordingly, referring to FIGS. 8 and 13, a solvent atmosphere may be formed in the sealed space due to a solvent in a gaseous state, evaporated from the solvent absorption plate 400. That is, the first organic layer 241b, which is formed on the array substrate 200 and has a non-uniform thickness, may be at least partially dissolved (S40). The cover plate 500 may apply heat to the solvent absorption plate 400 through thermal conduction, and as a result, the evaporation of the solvent from the solvent absorption plate 400 may be facilitated. Therefore, the first organic layer 241b on the array substrate 200 may be transformed into the organic film 241c, as illustrated in FIG. 15(c).

A second drying process may be performed on the organic film 241c (S50). For example, a vacuum dryer may be used in the second drying process, but embodiments are not limited thereto. That is, various drying methods other than that set forth herein may be used in the second drying process. The array substrate 200 may be subjected to the second drying process after being taken out of the chamber 100, but embodiments are not limited thereto. That is, the array substrate 200 may be subjected to the second drying process inside the chamber 100.

Figure 15D:
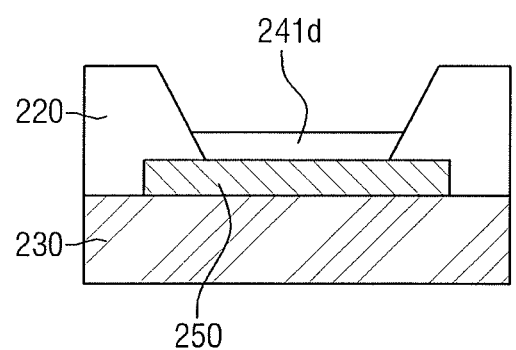

Referring to FIG. 15(d), a second organic layer 241d obtained from the second drying process may have a relatively uniform thickness. That is, a uniform thickness profile may be formed. The thickness of the second organic layer 241d may become uniform from the viewpoint of each individual pixel, and the thickness of an organic layer may also become uniform from the viewpoint of the entire array substrate 200.

By way of summation and review, exemplary embodiments provide an apparatus for fabricating an organic light-emitting diode (OLED) display device with an organic layer having a uniform thickness in each pixel. Exemplary embodiments also provide an apparatus for fabricating an OLED display device with an organic layer having a uniform thickness on an array substrate. Accordingly, it is possible to improve the profile properties of an OLED display device, which in turn, improve the characteristics and lifetime of an OLED display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for fabricating an organic light-emitting diode (OLED) display device, the apparatus comprising:
   a chamber;
   a stage disposed in the chamber and configured to support an array substrate;
   an organic layer disposed on the array substrate;
   a cover plate disposed in the chamber; and
   a solvent absorption plate disposed on a first surface of the cover and configured to dissolve a portion of the organic layer,
   wherein the solvent absorption plate includes a solvent, and
   wherein the organic layer is opposite to the solvent absorption plate.

2. The apparatus as claimed in claim 1, wherein the array substrate includes a first substrate, a plurality of first electrodes on the first substrate, a pixel-defining layer exposing at least some of the first electrodes therethrough, and an organic layer covering the first electrodes exposed by the pixel-defining layer.

3. The apparatus as claimed in claim 1, wherein the cover plate includes a first heat transfer unit below the solvent absorption plate, the first heat transfer unit being between a top surface of the cover and the solvent absorption plate, the top surface of the cover facing away from the solvent absorption plate.

4. The apparatus as claimed in claim 1, further comprising a solvent injection device to provide a stored solvent to the solvent absorption plate.

5. The apparatus as claimed in claim 4, wherein the solvent injection device is a roller that provides the stored solvent to the solvent absorption plate.

6. The apparatus as claimed in claim 4, wherein the solvent injection device is an inkjet head that ejects the stored solvent onto the solvent absorption plate through a plurality of nozzles.

7. The apparatus as claimed in claim 4, wherein the stored solvent is an organic solvent.

8. The apparatus as claimed in claim 1, further comprising:
a first sealing member contacting a first side of the stage in a lengthwise direction and a first side of the cover plate in the lengthwise direction; and
a second sealing member contacting a second side of the stage in the lengthwise direction and a second side of the cover plate in the lengthwise direction.

9. The apparatus as claimed in claim 8, wherein the array substrate is disposed in a sealed space defined by the stage, the cover plate, and the first and second sealing members, such that the solvent in the solvent absorption plate evaporates in the sealed space.

10. A method of fabricating an OLED display device, the method comprising:
providing a solvent to a solvent absorption plate;
placing an array substrate on a stage in a chamber;
placing a cover plate with the solvent absorption plate in the chamber, such that the solvent absorption plate faces the array substrate; and
allowing the solvent to condense onto at least part of an organic layer disposed on the array substrate, such that the solvent dissolves a portion of the organic layer.

11. The method as claimed in claim 10, wherein providing the solvent includes providing the solvent to the solvent absorption plate using a roller member.

12. The method as claimed in claim 10, wherein:
providing the solvent to the solvent absorption plate is performed outside the chamber, and
providing the solvent includes:
storing the solvent in an inkjet head with a plurality of nozzles; and
ejecting the solvent onto the solvent absorption plate through the nozzles.

13. The method as claimed in claim 10, wherein allowing the solvent to condense includes:
sealing the chamber to define a sealed space with first and second sealing members, the first sealing member contacting a first side of the stage in a lengthwise direction and a first side of the cover plate in the lengthwise direction, and the second sealing member contacting a second side of the stage in the lengthwise direction and a second side of the cover plate in the lengthwise direction, and
disposing the array substrate in the sealed space defined by the stage, the cover plate, and the first and second sealing members.

14. The method as claimed in claim 10, wherein allowing the solvent to condense includes heating the solvent absorption plate to a predetermined temperature.

15. The method as claimed in claim 10, further comprising drying the array substrate.

16. A method of fabricating an OLED display device, the method comprising:
forming a first organic layer by drying an array substrate having a first organic film thereon;
placing the dried array substrate on a stage in a chamber;
providing a solvent to a solvent absorption plate;
placing the solvent absorption plate on a cover plate;
placing the cover plate with the solvent absorption plate in the chamber;
forming a second organic film on the array substrate by allowing the solvent to evaporate from the solvent absorption plate; and
forming a second organic layer by drying the array substrate with the second organic film formed thereon.

17. The method as claimed in claim 16, wherein the solvent absorption plate and the cover plate are disposed in the chamber to face each other.

18. The method as claimed in claim 16, wherein providing the solvent includes providing a solvent stored in a roller member to the solvent absorption plate using a roller member or ejecting a solvent stored in an inkjet head with a plurality of nozzles onto the solvent absorption plate through the nozzles.

19. The method as claimed in claim 16, wherein providing the solvent includes ejecting a solvent stored in a slit nozzle onto the solvent absorption plate.

20. The method as claimed in claim 16, wherein forming the second organic film includes allowing the solvent to evaporate from the solvent absorption plate and to condense onto at least part of the first organic layer.

* * * * *